(12) United States Patent
Akari

(10) Patent No.: US 12,241,152 B2
(45) Date of Patent: Mar. 4, 2025

(54) HARD COATING FILM, AND MEMBER COATED WITH SAND-ABRASION-RESISTANT HARD COATING FILM WHICH INCLUDES SAME

(71) Applicant: KABUSHIKI KAISHA KOBE SEIKO SHO (KOBE STEEL, LTD.), Hyogo (JP)

(72) Inventor: Koichiro Akari, Nagoya (JP)

(73) Assignee: KABUSHIKI KAISHA KOBE SEIKO SHO (KOBE STEEL, LTD.), Hyogo (JP)

( * ) Notice: Subject to any disclaimer, the term of this patent is extended or adjusted under 35 U.S.C. 154(b) by 155 days.

(21) Appl. No.: 17/906,455

(22) PCT Filed: Mar. 12, 2021

(86) PCT No.: PCT/JP2021/009944
§ 371 (c)(1),
(2) Date: Sep. 15, 2022

(87) PCT Pub. No.: WO2021/205810
PCT Pub. Date: Oct. 14, 2021

(65) Prior Publication Data
US 2023/0145251 A1 May 11, 2023

(30) Foreign Application Priority Data
Apr. 6, 2020 (JP) .................................. 2020-068591

(51) Int. Cl.
*C23C 14/06* (2006.01)
(52) U.S. Cl.
CPC ................................ *C23C 14/0641* (2013.01)
(58) Field of Classification Search
None
See application file for complete search history.

(56) References Cited

U.S. PATENT DOCUMENTS

| | | | |
|---|---|---|---|
| 8,491,989 B2 * | 7/2013 | Lechthaler | C23C 14/0036 204/192.15 |
| 2013/0199351 A1 * | 8/2013 | Setoyama | C23C 14/5873 156/60 |

(Continued)

FOREIGN PATENT DOCUMENTS

| | | | |
|---|---|---|---|
| CN | 101818321 A | * | 9/2010 |
| EP | 1 800 736 A2 | | 6/2007 |
| EP | 2 669 031 A1 | | 12/2013 |

(Continued)

OTHER PUBLICATIONS

Dopita et al., "Interplay of microstructural features in Cr1-xAlxN and Cr1-x-yAlxSiyN nanocomposite coatings deposited by cathodic arc evaporation", Dec. 3, 2007, Surface & Coatings Technology, vol. 202, pp. 3199-3207 (Year: 2007).*
International Preliminary Report on Patentability and Written Opinion issued in PCT/JP2021/009944; mailed Oct. 20, 2022.
Meindlhumer M. et al., "Stress-controlled decomposition routes in cubic AlCrN films assessed by in-situ high-temperature high-energy grazing incidence transmission X-ray diffraction", Scientific Reports, vol. 9, No. 1, Dec. 2, 2019, doi: 10.1038/s41598-019-54307-7, 14 pages.

(Continued)

*Primary Examiner* — Seth Dumbris
(74) *Attorney, Agent, or Firm* — Studebaker & Brackett PC

(57) ABSTRACT

Provided is a hard coating film having excellent sand abrasion resistance. The present invention relates to a hard coating film (20) including a nitride containing Al and Cr as main components, the hard coating film (20) having a thickness of 6 μm or more.

7 Claims, 2 Drawing Sheets

(56) References Cited

U.S. PATENT DOCUMENTS

2014/0013914 A1* 1/2014 Senbokuya .......... C23C 28/048
427/580
2014/0200132 A1 7/2014 Yamamoto et al.

FOREIGN PATENT DOCUMENTS

| | | |
|---|---|---|
| JP | H06-170584 A | 6/1994 |
| JP | H10-259790 A | 9/1998 |
| JP | 2006-043874 A | 2/2006 |
| JP | 2006-162045 A | 6/2006 |
| JP | 2007-332890 A | 12/2007 |

OTHER PUBLICATIONS

Tritremmel Christian, "Comparison of Magnetron Sputtering and Arc Evaporation by Al—Cr—N hard coatings", Diploma Thesis, Jun. 1, 2007, Montanuniversität Leoben, https://pureadmin.unileoben.ac.at/ws/portalfiles/portal/2274676/AC06045311n01vt.pdf, 89 pages.
The extended European search report issued by the European Patent Office on Jun. 30, 2023, which corresponds to European Patent Application No. 21785229.2-1103 and is related to U.S. Appl. No. 17/906,455.

* cited by examiner

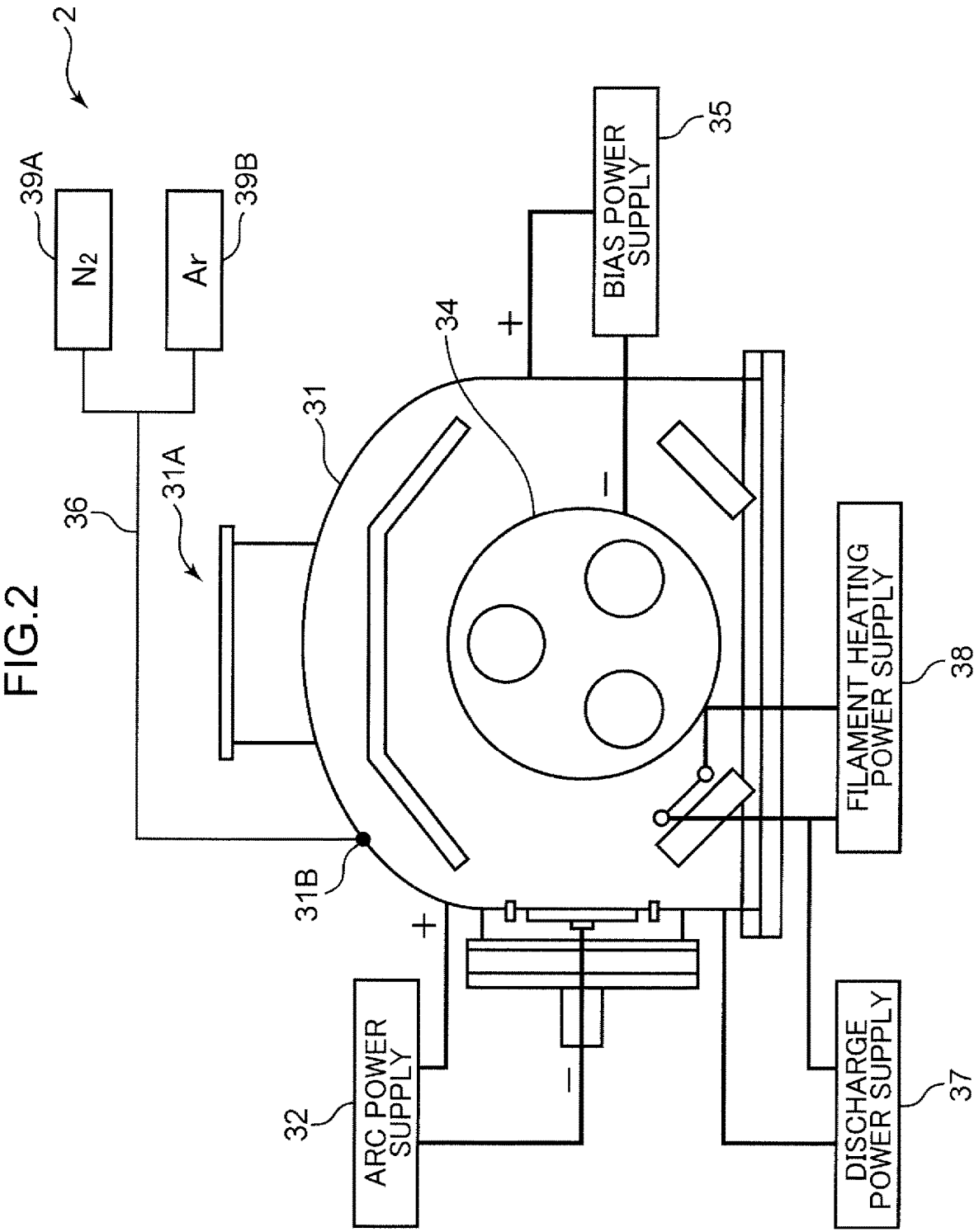

HARD COATING FILM, AND MEMBER COATED WITH SAND-ABRASION-RESISTANT HARD COATING FILM WHICH INCLUDES SAME

TECHNICAL FIELD

The present invention relates to a hard coating film, and a sand-abrasion-resistant hard-coating-film coated member including a substrate and the hard coating film formed on at least a part of a surface of the substrate, the surface being subjected to sand abrasion.

BACKGROUND ART

A fluid kneading member such as a rotor for resin kneading and a hydraulic member such as a pump are subjected to abrasive wear during use thereof because a hard substance is mixed in a resin, water, or the like. Examples of the mixed hard substance include silica, carbon, and other substances contained in sand. Additionally, a specific member of a construction machine is also subjected to similar wear during use thereof because of being directly brought into contact with sand. The specific member is, for example, a bucket. Therefore, a part of a surface of such a member is covered with a hard coating film, thereby improving sand abrasion resistance. As a coating film forming technique to form a hard coating film, a plating method, a thermal spraying method, or a build-up welding method has been proposed.

For example, Patent Literature 1 discloses a high-C high-Si containing weld metal powder including a welding material containing Fe as a main component and Cr in a content of 16 to 25 percent by weight; containing C in a content of 0.9 to 2.0 percent by weight, Si in a content of 2.0 to 5 percent by weight, Mn in a content of 10 percent by weight or less, Cr in a content of 16 to 25 percent by weight, Ni in a content of 5 to 20 percent by weight, and Ni+Mn in a content of 6 to 25 percent by weight with the remainder including entrained inevitable impurities; and having a C/Si ratio of 0.2 to 0.7, preferably 0.22 to 0.67.

Meanwhile, Patent Literature 2 discloses a pump including: a casing configured to form a flow path for a fluid; an impeller disposed in the flow path and including a boss located at a center portion of the impeller, a shroud surrounding the boss, and a blade coupling the boss and the shroud together; and a shaft fitted to the boss to rotate the impeller, in which surfaces of the impeller and the casing, the surfaces being brought into contact with the fluid, include a region where a first coating film selected from the group consisting of a coating film of a Ni alloy, a coating film of a boron diffusion layer, and a coating film of a chromium diffusion layer is formed, and a region where a second coating film containing metal and carbide is formed.

CITATION LIST

Patent Literature

Patent Literature 1: JPH 06-170584 A
Patent Literature 2: JPH 10-259790 A

SUMMARY OF INVENTION

For a material used for build-up welding or the like, evaluation of the sand abrasion resistance is conducted. That is, in general, it has been found that the higher the hardness of the material is, the better the sand abrasion resistance tends to be. Therefore, the present inventor has attempted to subject the relevant member to plating, thermal spraying, or build-up welding using a material having a hardness higher than that of a member material such as an iron-based alloy material, and further, thickening the relevant coating film, thereby improving the sand abrasion resistance.

However, in the attempt to further improve the sand abrasion resistance of the hard coating film using such an approach, it has been found that the level of the improvement is limited. Specifically, the hardest hard coating film among hard coating films formed by plating, thermal spraying, or build-up welding is a coating film formed by thermal spraying using a tungsten carbide-based alloy metal. However, the hardness of the hardest hard coating film is about 1500 HV in Vickers hardness. Thus, there is no large difference between the hardness of the hardest hard coating film and the hardness of a hard substance, such as silica, which causes sand wear. Therefore, it is hard to say that the approach as described above can sufficiently improve the sand abrasion resistance of the hard coating film.

Additionally, in the case of forming a hard coating film on a member having a relatively large size and a wide range of regions requiring sand abrasion resistance, for example, on a fluid kneading member such as a rotor for resin kneading, a hydraulic member such as a pump and the like, the method of thickening the coating film may involve a burden and the like in terms of coating film formation time and cost. Therefore, there is room for improvement in various points regarding the hard coating film having sand abrasion resistance.

Thus, an object of the present invention is to provide a hard coating film having excellent sand abrasion resistance.

As a result of intensive studies to solve the above problems, the present inventor has accomplished the present invention.

That is, a hard coating film according to an aspect of the present invention comprises a nitride containing Al and Cr as main components, and has a thickness of 6 μm or more.

BRIEF DESCRIPTION OF DRAWINGS

FIG. 2 is a view schematically illustrating a configuration of a coating film formation apparatus used in an example of a method for manufacturing the sand-abrasion-resistant hard-coating-film coated member according to the embodiment of the present invention.

DESCRIPTION OF EMBODIMENTS

Figure 1:
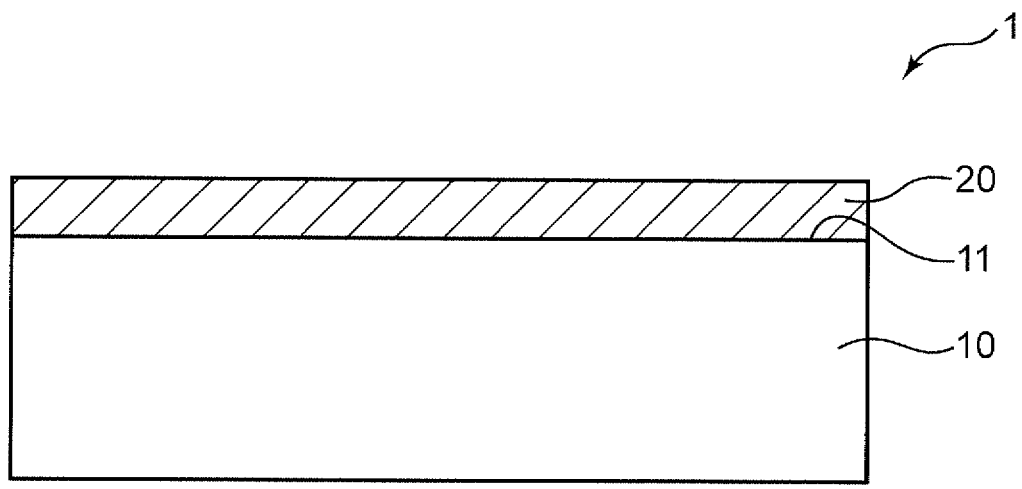
FIG. 1 is a view schematically illustrating a configuration of a sand-abrasion-resistant hard-coating-film coated member according to an embodiment of the present invention.

The present inventor has conducted various studies on hard coating films exhibiting more effective sand abrasion resistance, and has focused on component compositions of the hard coating films and further on coating film thicknesses exhibiting excellent sand abrasion resistance in the component compositions to complete the present invention.

That is, a hard coating film according to an aspect of the present invention comprises a nitride containing Al and Cr as main components, and has a thickness of 6 μm or more. The hard coating film according to the aspect of the present invention has excellent sand abrasion resistance.

Hereinafter, an embodiment of the present invention will be described in detail. Note that, the scope of the present invention is not limited to the embodiment described herein, and various modifications can be made without departing from the spirit of the present invention.

<Hard Coating Film>

The hard coating film according to the present embodiment comprises a nitride containing Al and Cr as main components.

The phrase "containing Al and Cr as main components" in the present specification means that a proportion obtained by adding an atomic ratio of Al and an atomic ratio of Cr is 0.5 or more in an atomic ratio of the component composition, excluding nitrogen, of the hard coating film. That is, the hard coating film according to the present embodiment has the component composition represented by the formula: $(Al_xCr_yM_{1-x-y})N$ (where, x>0, y>0, and 1≥x+y≥0.5).

In the above formula, M represents one or more optional elements other than Al and Cr. M is not particularly limited, but is, for example, one or more elements selected from Ti, Si, Mn, Ni, V, Zr, Nb, Mo, Ta, W, Y, and lanthanoids (excluding Pm), and preferably one or more elements selected from Ti and Si. The inclusion of these elements M other than Al and Cr in the component composition of the hard coating film can improve other functions such as oxidation resistance and fatigue resistance life of the hard coating film.

In the above formula, preferably x+y=0.75, more preferably x+y>0.75, still more preferably x+y≥0.8, yet more preferably x+y≥0.85, particularly preferably x+y≥0.9, or particularly preferably x+y=1. That is, in the component composition, excluding nitrogen, of the hard coating film, the sand abrasion resistance of the hard coating film tends to be remarkably improved by bringing the value obtained by adding the atomic ratio of Al and the atomic ratio of Cr closer to 1.

In the above formula, preferably x≥y. That is, in the component composition, excluding nitrogen, of the hard coating film, the sand abrasion resistance of the hard coating film tends to be improved by making the atomic ratio of Al larger than the atomic ratio of Cr. For example, in the above formula, preferably x≥0.4, more preferably x≥0.5, still more pfeferably x≥0.55, and yet more preferably x≥0.65. As a specific numerical value, for example, preferably x=0.5, more preferably x=0.55, still more preferably x=0.65, and yet more preferably x=0.7. An upper limit of x, that is, an upper limit of the atomic ratio of Al is not limited, but is, for example, x≤0.9 or x≤0.85.

Thus, examples of the component composition of the hard coating film according to the present embodiment include $(Al_{0.5}Cr_{0.5})N$, $(Al_{0.6}Cr_{0.4})N$, $(Al_{0.65}Cr_{0.35})N$, $(Al_{0.7}Cr_{0.3})N$, $(Al_{0.75}Cr_{0.25})N$, $(Al_{0.8}Cr_{0.2})N$, $(Al_{0.65}Cr_{0.1}Ti_{0.25})N$, $(Al_{0.70}Cr_{0.27}Ti_{0.03})N$, $(Al_{0.55}Cr_{0.2}Ti_{0.2}Si_{0.05})N$, or $(Al_{0.55}Cr_{0.2}Ti_{0.2}Si_{0.03}Y_{0.02})N$.

The hard coating film according to the present embodiment has a thickness of 6 µm or more. In the case where the component composition of the hard coating film is a nitride containing Al and Cr as main components, the sand abrasion resistance of the hard coating film can be remarkably improved by forming the hard coating film to have a thickness of 6 µm or more, particularly 6.7 µm or more. In particular, a hard coating film having a thickness of less than 6 µm fails to function as a coating film intended for sand abrasion resistance. Specifically, when the hard coating film is subjected to abrasion by sand, most of the hard coating film will be abraded in a short time.

The hard coating film has a thickness of preferably 6.7 µm or more, more preferably 7 µm or more, still more preferably 10 µm or more, or particularly preferably 20 µm or more. The upper limit of the thickness of the hard coating film is not particularly limited, but may be any value as long as it is, for example, 100 µm or less, from the viewpoint of cost burden and the like. Alternatively, the thickness of the hard coating film may be adjusted so as to conform to a type, a use environment, a use period, and the like of the member on which the hard coating film according to the present embodiment is formed. Examples of the member include resin kneader components (e.g., rotor and casing), rubber kneader components (e.g., rotor and casing), submersible pump components and sand pump components (e.g., impeller, blade, and casing), waterwheel components (e.g., runner, bucket, liner, guide vane, needle, and nozzle), components (e.g., bucket and traveling body component) of a construction machine such as a hydraulic excavator, and the like.

In the present specification, the thickness of the hard coating film is an actual value measured by coating film cross section measurement using a calotester or a scanning electron microscope in the same manner as in examples to be described later.

The hard coating film according to the present embodiment is preferably a coating film formed by a physical vapor deposition (PVD) method such as an arc ion plating (AIP) method or a sputtering method. By forming a coating film using such a physical vapor deposition method, a hard coating film having a desired component composition and a desired thickness can be efficiently formed with high accuracy. An example of a method for forming a hard coating film according to the present embodiment will be described in detail later.

In the hard coating film according to the present embodiment, a sand abrasion mass loss of a hard-coating-film coated test piece for 30 minutes (hereinafter, also simply referred to as "sand abrasion mass loss for 30 minutes") is preferably 0.05 g or less, the sand abrasion mass loss being measured by using a sand abrasion tester complying with the ASTM-G65 standards under the same conditions and according to the same method as those in the examples to be described later. The sand abrasion mass loss for 30 minutes is more preferably 0.03 g or less, still more preferably 0.01 g or less, yet more preferably 0.0074 g or less, particularly preferably 0.0047 g or less, or particularly preferably 0.0036 g or less. A lower limit of the sand abrasion mass loss for 30 minutes is not particularly limited, and is, for example, 0 g or more. The smaller the sand abrasion mass loss for 30 minutes is, the more excellent the sand abrasion resistance of the hard coating film is.

Alternatively, in the hard coating film according to the present embodiment, a sand abrasion mass loss rate calculated based on a mass loss of the hard-coating-film coated test piece from 10 minutes to 30 minutes (hereinafter, simply referred to as "sand abrasion mass loss rate") is preferably 0.0015 g or less, the sand abrasion mass loss rate being measured by using a sand abrasion tester complying with the ASTM-G65 standards under the same conditions and according to the same method as those in the examples to be described later. The sand abrasion mass loss rate is more preferably 0.001 g/min or less, still more preferably 0.0002 g/min or less, yet more preferably 0.0001 g/min or less, or particularly preferably 0.00005 g/min or less. A lower limit of the sand abrasion mass loss rate is not particularly limited, and is, for example, 0 g/min or more. The lower the sand abrasion mass loss rate is, the more excellent the sand abrasion resistance of the hard coating film is.

As can be seen from the examples to be described later, the characteristics of the hard coating film in which the sand abrasion mass loss for 30 minutes is 0.05 g or less or sand abrasion mass loss rate is 0.0015 g/min or less are characteristics that have not been achieved even by using methods such as Cr plating and spraying of a tungsten carbide-based superhard material. Additionally, the characteristics of the hard coating film are characteristics that have not been able to be achieved also in a case where the component composition, other than nitrogen, of the hard coating film does not satisfy the conditions in the present embodiment, or where the component composition of the hard coating film satisfies the conditions in the present embodiment but the coating film thickness is less than 6 μm. That is, the hard coating film according to the present embodiment exhibits excellent sand abrasion resistance, which is unpredictable from the background art, on condition that a nitride containing Al and Cr as main components is selected for the component composition of the hard coating film, and the coating film thickness is set to 6 μm or more, preferably 6.7 μm or more.

<Sand-Abrasion-Resistant Hard-Coating-Film Coated Member>

A sand-abrasion-resistant hard-coating-film coated member according to the present embodiment will be described with reference to FIG. 1. Respective reference signs in FIG. 1 denote the following: a sand-abrasion-resistant hard-coating-film coated member 1, a substrate 10, a surface 11, and a hard coating film 20.

As illustrated in FIG. 1, the sand-abrasion-resistant hard-coating-film coated member 1 according to the present embodiment includes the substrate 10 and the hard coating film 20 according to the above-described embodiment, the hard coating film 20 being formed on the surface 11 of the substrate 10. The hard coating film 20 is only required to be formed on at least a part of the surface 11 of the substrate 10, the surface 11 being subjected to abrasion by a sand component contained in a liquid or a solid.

In the present specification, the phrase "sand component contained in a liquid or a solid" (or hereinafter also simply referred to as "sand component") means silica, carbon, lime, coal, or a hard substance containing an element such as Si, C, Ca, Al, Fe, Mg, K, or Na contained in a fluid such as a slurry, an aqueous solution, a suspension, oil, water, a resin in a molten state, or a rubber in a molten state; in a solid-liquid mixture; or in a solid such as soil.

The sand-abrasion-resistant hard-coating-film coated member 1 is not particularly limited as long as it is a member requiring sand abrasion resistance. Examples of the member include resin kneader components (e.g., rotor and casing), rubber kneader components (e.g., rotor and casing), submersible pump components and sand pump components (e.g., impeller, blade, and casing), waterwheel components (e.g., runner, bucket, liner, guide vane, needle, and nozzle), components (e.g., bucket and traveling body component) of a construction machine such as a hydraulic excavator, and the like.

The substrate 10 is a main constituent part of the sand-abrasion-resistant hard-coating-film coated member 1. Thus, the material of the substrate 10 is also not particularly limited. Examples of the material of the substrate 10 include iron-based materials such as chromium-molybdenum steel (e.g., SCM440), carbon steel for machine structure (e.g., S25C), rolled steel for general structure (e.g., SS400), high-speed tool steel (e.g., SKH51), alloy tool steel (e.g., SKD51), and stainless steel (e.g., SUS304), and non-ferrous metal materials such as a Ti alloy and an aluminum alloy.

Next, a description will be given of an example of a method for manufacturing the sand-abrasion-resistant hard-coating-film coated member according to the embodiment of the present invention. The manufacturing method in this example is a method of forming the hard coating film 20 on the surface 11 of the substrate 10 by an arc ion plating method to manufacture the sand-abrasion-resistant hard-coating-film coated member 1. First, a configuration of a coating film formation apparatus 2 used for forming the hard coating film 20 in the method will be described with reference to FIG. 2. Respective reference signs in FIG. 2 denote the following: the coating film formation apparatus 2, a chamber 31, a gas exhaust port 31A, a gas supply port 31B, an arc power supply 32, a stage 34, a bias power supply 35, a gas introduction path 36, a discharge power supply 37, a filament heating power supply 38, a nitrogen gas supply source 39A, and an argon gas supply source 39B. As illustrated in FIG. 2, the coating film formation apparatus 2 mainly includes the chamber 31, the arc power supply 32, the stage 34, the bias power supply 35, a heater (not illustrated), the discharge power supply 37, and the filament heating power supply 38.

The chamber 31 has a space therein for forming the hard coating film 20. The chamber 31 further has, on its wall, the gas exhaust port 31A for evacuating the inside of the chamber 31 and the gas supply port 31B for supplying coating film forming gas (e.g., nitrogen gas) and argon gas into the chamber 31. As illustrated in FIG. 2, the nitrogen gas supply source 39A and the argon gas supply source 39B are disposed outside the chamber 31. The nitrogen gas supply source 39A and the argon gas supply source 39B are connected to the gas supply port 31B through the gas introduction path 36. Furthermore, a positive bias side of the arc power supply 32 is connected to the chamber 31.

The stage 34 is disposed at the center in the chamber 31 and is configured to be rotatable. The stage 34 has a support surface for supporting the substrate 10 on which a coating film is to be formed. A negative side of the bias power supply 35 is connected to the stage 34. The bias power supply 35 applies a negative bias voltage to the substrate 10 through the stage 34 during coating film formation. A positive side of the bias power supply 35 is connected to the chamber 31.

Next, a description will be given of a procedure of a method for manufacturing the sand-abrasion-resistant hard-coating-film coated member 1 according to the present embodiment. In this method, first, a step of placing the substrate 10 on the stage 34 of the coating film formation apparatus 2 is performed (substrate placement step). In the substrate placement step, first, the substrate 10 is cleaned using a cleaning liquid such as ethanol. Then, the substrate 10 after cleaning is introduced into the chamber 31 and placed on the stage 34.

Next, a step of placing a target in the coating film formation apparatus 2 (in the chamber 31) is performed (target placement step). In the target placement step, a target having a component of an element, other than nitrogen, of the hard coating film 20 is prepared, and in order for the target to function as a cathode, the target is set in an evaporation source connected to the negative bias side of the arc power supply 32.

The target contains Al and Cr as main components, and is specifically an AlCr target, an AlCrTi target, an AlCrTiSi target, or the like. A content ratio of each element in the target is adjusted in accordance with an atomic ratio of each element in the hard coating film 20 to be formed.

Next, a step of etching the substrate 10 is performed (substrate etching step). In the substrate etching step, first, the inside of the chamber 31 is decompressed to a predetermined pressure by exhausting air from the chamber 31 through the gas exhaust port 31A, thus obtaining a vacuum state. Next, the heater heats the substrate 10 to a predetermined temperature. Then, Ar gas is introduced into the chamber 31 through the gas supply port 31B, and the surface 11 (surface on which a coating film is formed) of the substrate 10 is etched with Ar ions for a predetermined time by Ar plasma generated during the operation of the filament heating power supply 38 and the discharge power supply 37. Consequently, an oxide film or the like formed on the surface 11 of the substrate 10 is removed. The substrate etching step is not an essential step of the method for manufacturing the sand-abrasion-resistant hard-coating-film coated member 1 according to the present embodiment, and may be omitted.

Thereafter, a step of forming the hard coating film 20 on the surface 11 of the substrate 10 is performed (coating film formation step). In the coating film formation step, first, the inside of the chamber 31 is adjusted to a predetermined coating film forming pressure by introducing nitrogen gas through the gas supply port 31B into the chamber 31. Then, a predetermined arc current is applied to the target in a state where the inside of the chamber 31 is made into an atmosphere containing nitrogen gas, thereby evaporating the target. Consequently, vapor-deposited particles of the target that have been evaporated and ionized react with nitrogen in the chamber 31, and are deposited on the surface 11 of the substrate 10. As a result, the hard coating film 20 having the component composition such as $(Al_{0.5}Cr_{0.5})N$, $(Al_{0.7}Cr_{0.3})N$, $(Al_{0.65}Cr_{0.1}T_{0.25})N$, or $(Al_{0.55}Cr_{0.2}Ti_{0.2}Si_{0.05})N$ is formed on the substrate 10. In this coating film formation step, the hard coating film 20 is formed while the negative bias voltage (direct-current voltage) is applied from the stage 34 to the substrate 10. In forming the hard coating film 20, supply time of the arc current and voltage application time are adjusted, thereby forming the hard coating film 20 to have a thickness of 6 μm or more.

The method for forming the hard coating film 20 is not limited to the above-described arc ion plating method, and may be, for example, a sputtering method. In the case of forming the hard coating film 20 by the sputtering method, the above-described target is only required to be connected to a sputtering power supply (not illustrated). Then, the inside of the chamber 31 is adjusted to a predetermined coating film forming pressure for sputtering, and the target is supplied with predetermined electric power, to be evaporated. Thus, the hard coating film 20 can be formed in the same manner as in the arc ion plating method.

As described above, the hard coating film according to the present embodiment is formed on the surface of the substrate, and thus damage, caused by sand abrasion, to the surface of the substrate can be remarkably reduced. In particular, according to the hard coating film according to the present embodiment, as long as the hard coating film has a thickness of 6 μm or more, preferably 6.7 μm or more, the hard coating film exhibits remarkably excellent sand abrasion resistance as compared with the coating film applied for sand abrasion resistance in the background art. Thus, it is advantageous in that the hard coating film according to the present embodiment can reduce a burden and the like in terms of coating film formation time and cost in a case where the hard coating film is applied to a member having a relatively large size and having a wide range of regions requiring sand abrasion resistance. Examples of the member include resin kneader components (e.g., rotor and casing), rubber kneader components (e.g., rotor and casing), submersible pump components and sand pump components (e.g., impeller, blade, and casing), waterwheel components (e.g., runner, bucket, liner, guide vane, needle, and nozzle), and components (e.g., bucket and traveling body component) of a construction machine such as a hydraulic excavator, and the like.

Although the overview of the present invention has been described above, the hard coating film in the present embodiment is summarized as follows.

The hard coating film according to the aspect of the present invention comprises the nitride containing Al and Cr as main components, and has the thickness of 6 μm or more.

The hard coating film having such a configuration has excellent sand abrasion resistance.

In the hard coating film, a sand abrasion mass loss of a hard-coating-film coated test piece for 30 minutes is preferably 0.05 g or less, the sand abrasion mass loss being measured by using a sand abrasion tester complying with the ASTM-G65 standards under conditions below:
  substrate dimension of hard-coating-film coated test piece: flat plate shape of 25 mm×75 mm×8 mm (thickness),
  disc dimensions: width 12.7 mm×Φ 220 mm,
  test force: 127.5 N (13 kgf),
  test sand: No. 6 silica sand, flow rate: 350 g/min,
  wheel rotation speed: 200 rpm, and
  test time: 30 minutes.

The hard coating film is more preferably a coating film formed by a physical vapor deposition method.

A sand-abrasion-resistant hard-coating-film coated member according to another aspect of the present invention comprises a substrate and the hard coating film according to any one of the above-described aspects, and the hard coating film is formed on at least a part of a surface of the substrate, the surface being subjected to abrasion by a sand component contained in a liquid or a solid.

According to the sand-abrasion-resistant hard-coating-film coated member having such a configuration, excellent sand abrasion resistance is exhibited in the portion where the hard coating film is formed, and thus abrasive wear which occurs in the member due to a sand component in a liquid or a solid can be reduced.

The sand-abrasion-resistant hard-coating-film coated member is preferably selected from resin kneader components (e.g., rotor and casing), rubber kneader components (e.g., rotor and casing), submersible pump components and sand pump components (e.g., impeller, blade, and casing), waterwheel components (e.g., runner, bucket, liner, guide vane, needle, and nozzle), and components (e.g., bucket and traveling body component) of a construction machine such as a hydraulic excavator.

EXAMPLES

Hereinafter, the present invention will be described more specifically with reference to examples, but the present invention is not limited by the examples at all.

In the examples, a hard-coating-film coated test piece was prepared by simulating actual manufacture of a hard-coating-film coated member, and the sand abrasion resistance of the hard-coating-film coated test piece was evaluated.
<Formation of Hard Coating Film>

Each of hard coating films in test pieces No. 1 to No. 11 shown in Table 1 below was formed on a substrate by the arc ion plating method described in the above-described embodiment, using a coating film formation apparatus (AIP-SS002 and AIPocket manufactured by Kobe Steel, Ltd.) having the configuration illustrated in FIG. 2.

As the substrate, a chromium-molybdenum steel piece (SCM440, buffing finish) processed into a flat plate shape of 25 mm×75 mm×8 mm (thickness) was used.

The target used was an AlCr target (target diameter: 100 mmφ), an AlCrTi target (target diameter: 100 mmφ), an AlCrTiSi target (target diameter: 100 mmφ), a Cr target (target diameter: 100 mmφ), or an AlTi target (target diameter: 100 mmφ) having an atomic ratio same as component composition, excluding nitrogen, of each of the hard coating films in the test pieces No. 1 to No. 11.

The substrate (SCM440) was introduced into a chamber of the coating film formation apparatus and placed on a stage, and the target corresponding to each of the test pieces No. 1 to No. 11 was set in an evaporation source connected to a negative bias side of an arc power supply. Then, nitrogen gas was introduced into the chamber, and a pressure in the chamber was set to 4 Pa. Furthermore, the heater was operated to set a temperature in the chamber to about 400° C. Thereafter, the target was evaporated by applying an arc current of 150 A, and a hard coating film having component composition corresponding to each of the test pieces No. 1 to No. 11 was formed on the surface of the substrate (SCM440). During the coating film formation, a bias voltage (direct-current voltage) applied from the stage to the substrate (SCM440) was set to −30 V to −65 V depending on a coating film type. Each of thicknesses of the respective hard coating films corresponding to the test pieces No. 1 to No. 11 was adjusted by deposition time, and after the deposition, actual thicknesses were measured by a calotester (Auto Crater manufactured by Nanotec Corporation) or cross section measurement using a scanning electron microscope (JSM-6010 manufactured by JEOL Ltd.). Specifically, the calotester was used for the coating film having a thickness of less than 10 μm, and the electron microscope was used for the coating film having a thickness of 10 μm or more. In this manner, hard-coating-film coated test pieces employed as the test pieces No. 1 to No. 11 each using SCM440 as the substrate were prepared.

A test piece No. 12 was a test piece in which a hard coating film is not formed on the substrate (SCM440). Each of the test pieces No. 13 to No. 15 was a hard-coating-film coated test piece in which S25C that is carbon steel was used as the substrate and Cr plating was applied to the substrate (S25C). Specifically, the test pieces No. 13 to No. 15 were hard-coating-film coated test pieces respectively applied with, as coating films, Cr plating manufactured by Nishimori Plating Industry Co., Ltd.; Cr plating manufactured by TOKUSHU GIKEN Co., Ltd.; or Cr plating manufactured by Himeji Electric plating Co., Ltd. A test piece No. 16 was a hard-coating-film coated test piece in which a tungsten carbide (WC) thermal spray coating film (using a thermal spray material manufactured by TOCALO Co., Ltd.) was formed on the substrate (S25C). The size and shape of these substrates (SCM440 or S25C) were the same as those of the substrates (SCM440) of the above-described test pieces No. 1 to No. 11. The hard coating films in the test pieces No. 13 to No. 16 each had a thickness of 300 μm.

<Evaluation of Sand Abrasion Resistance>

For each of the prepared hard-coating-film coated test pieces, sand abrasion mass loss (g) of the hard-coating-film coated test piece for 30 minutes was measured by using a sand abrasion tester ("abrasion wear tester" manufactured by Kobe Steel, Ltd.) complying with the ASTM-G65 standards under the following conditions. Furthermore, the sand abrasion mass loss rate (g/min) was calculated based on the mass loss from 10 minutes to 30 minutes. The smaller the sand abrasion mass loss is or the lower the sand abrasion mass loss rate is, the more excellent the sand abrasion resistance of the hard-coating-film coated test piece is. The measured and calculated results are collectively shown in Table 1 below together with the component compositions of the hard coating films of the test pieces, the measured coating film thicknesses, the types of the substrates, and the states of the coating films of the hard-coating-film coated test pieces after 30 minutes.

Measurement conditions

Substrate dimension of hard-coating-film coated test piece: flat plate shape of 25 mm×75 mm×8 mm (thickness)
Disc dimensions: width 12.7 mm×Φ 220 mm
Test force: 127.5 N (13 kgf)
Test sand: No. 6 silica sand, flow rate: 350 g/min
Wheel rotation speed: 200 rpm
Test time: 30 minutes

TABLE 1

| Test piece No. | Category | Component composition of hard coating film | Coating film thickness (μm) | Substrate | Sand abrasion mass loss for 30 minutes (g) | Sand abrasion mass loss rate (from 10 min to 30 min) (g/min) | State of coating film after 30 minutes |
| --- | --- | --- | --- | --- | --- | --- | --- |
| 1 | Example | $(Al_{0.7}Cr_{0.3})N$ | 6.7 | SCM440 | 0.0036 | 0.00010 | Almost coating film remained (substrate exposed in very limited region) |
| 2 | Example | $(Al_{0.7}Cr_{0.3})N$ | 9.8 | SCM440 | 0.0022 | 0.00004 | Coating film remained |
| 3 | Example | $(Al_{0.7}Cr_{0.3})N$ | 19.5 | SCM440 | 0.0021 | 0.00005 | Coating film remained |
| 4 | Example | $(Al_{0.7}Cr_{0.3})N$ | 41.8 | SCM440 | 0.0025 | 0.00004 | Coating film remained |
| 5 | Example | $(Al_{0.7}Cr_{0.3})N$ | 59.2 | SCM440 | 0.0034 | 0.00008 | Coating film remained |
| 6 | Example | $(Al_{0.5}Cr_{0.5})N$ | 20.4 | SCM440 | 0.0024 | 0.00004 | Coating film remained |
| 7 | Example | $(Al_{0.65}Cr_{0.1}Ti_{0.25})N$ | 19.6 | SCM440 | 0.0074 | 0.00020 | Coating film remained |
| 8 | Example | $(Al_{0.55}Cr_{0.2}Ti_{0.2}Si_{0.05})N$ | 15.4 | SCM440 | 0.0047 | 0.00010 | Coating film remained |
| 9 | Comparative Example | $(Al_{0.7}Cr_{0.3})N$ | 5.0 | SCM440 | 2.8354 | 0.1164 | Substrate wholly exposed |
| 10 | Comparative Example | CrN | 43.7 | SCM440 | 2.8956 | 0.1130 | Substrate wholly exposed |
| 11 | Comparative Example | $(Al_{0.67}Ti_{0.33})N$ | 24.0 | SCM440 | 0.4819 | 0.0237 | Substrate mostly exposed |
| 12 | Comparative Example | None | — | SCM440 | 3.9385 | 0.1191 | — |
| 13 | Comparative Example | Cr Plating A | 300 | S25C | 2.5004 | 0.0923 | — |
| 14 | Comparative Example | Cr Plating B | 300 | S25C | 1.3471 | 0.0569 | — |
| 15 | Comparative Example | Cr Plating C | 300 | S25C | 0.3444 | 0.0119 | — |
| 16 | Comparative Example | WC thermal spraying | 300 | S25C | 0.0754 | 0.0019 | — |

<Consideration>

As shown in Table 1 above, each of the test pieces No. 1 to No. 8, in which the component composition of the hard coating film and the coating film thickness satisfied the conditions in the present embodiment, had a smaller sand abrasion mass loss for 30 minutes, a lower sand abrasion mass loss rate, and excellent sand abrasion resistance. In particular, the hard coating films of the test pieces No. 1 to No. 6 each having component composition of a nitride containing only Al and Cr tended to be more excellent in sand abrasion resistance than the hard coating films of the test pieces No. 7 and No. 8 each having component composition containing one or more elements in addition to Al and Cr.

On the other hand, although the component composition of the hard coating film satisfied the conditions in the present embodiment, the test piece No. 9 having a coating film thickness of 5.0 μm had an extremely increased sand abrasion mass loss for 30 minutes and an extremely increased sand abrasion mass loss rate, as compared with the test piece No. 1 having a coating film thickness of 6.7 μm. That is, the test piece No. 9 had extremely poor sand abrasion resistance. Furthermore, in the state of the coating film of the test piece No. 9 after 30 minutes, the substrate was wholly exposed.

The component composition of the hard coating film of the test piece No. 10 was a nitride of Cr, and the component composition of the hard coating film of the test piece No. 11 was a nitride of $Al_{0.67}Ti_{0.33}$. Thus, these test pieces did not satisfy the conditions in the present embodiment in the component composition of the hard coating film. Thus, as compared with the test pieces of the examples, the test piece No. 10 had an extremely increased sand abrasion mass loss, an extremely increased sand abrasion mass loss rate, and extremely poor sand abrasion resistance. Furthermore, in the state of the coating film of the test piece No. 10 after 30 minutes, the substrate was wholly exposed. In the test piece No. 11, although not as much as the test piece No. 10, the substrate was mostly exposed in the state of the coating film after 30 minutes, and the test piece No. 11 was inferior in sand abrasion resistance to the test pieces of the examples. On the other hand, from the viewpoint of hardness, there was no much difference between the nitride of $Al_{0.67}Ti_{0.33}$ in the test piece No. 11 and for example, the nitride of $Al_{0.7}Cr_{0.3}$. Thus, according to the hard coating film in the present embodiment, it is presumed that not only a factor of hardness but also a factor of a combination of Al and Cr as main components has a suitable influence on the function of the sand abrasion resistance.

The hard coating film was not formed on the test piece No. 12, and thus the measured sand abrasion mass loss and the measured sand abrasion mass loss rate were an abrasion mass loss and an abrasion mass loss rate of the substrate (SCM440).

The test pieces No. 13 to No. 16 were hard-coating-film coated test pieces prepared by a plating technique or a thermal spraying technique that is currently widely used as a technique for improving the sand abrasion resistance. The types of the substrates are different from those of the test pieces No. 1 to No. 11, but according to the evaluation method of the sand abrasion resistance under the above-described conditions, it is conceived that the difference of the substrates need not be generally considered in the comparison of the numerical values of the sand abrasion mass loss and the sand abrasion mass loss rate. Each of the test pieces had the extremely large coating film thickness as compared with the test pieces of the examples. However, each of the test pieces had an extremely increased sand abrasion mass loss, an extremely fast sand abrasion mass loss rate, and poor sand abrasion resistance.

This application is based on Japanese Patent Application No. 2020-068591 filed on Apr. 6, 2020, the contents of which are incorporated herein.

The present invention has been appropriately and sufficiently described through the embodiments and the examples with reference to specific examples and the like in the foregoing to express the present invention, but it should be recognized that a person skilled in the art can easily change and/or improve the above-described embodiments and the above-described examples. Therefore, unless a change or improvement made by a person skilled in the art is at a level departing from the scope of rights of the claims described in claims, the change or improvement is interpreted to be included in the scope of rights of the claims.

INDUSTRIAL APPLICABILITY

According to the present invention, in the technical field related to the hard coating film having sand abrasion resistance, it is possible to improve sand abrasion resistance of various members including a fluid kneading member such as a rotor for resin kneading and a hydraulic member such as a pump. Thus, the present invention has wide industrial applicability.

The invention claimed is:

1. A sand-abrasion-resistant hard coating film comprising a nitride containing Al and Cr as main components,
    the hard coating film having a composition represented by the formula: $(Al_xCr_y)N$ (where, $0.75 \geq x \geq 0.55$, $y > 0$, $x > y$ and $x+y=1$) and having a thickness of 20.4 μm or more, wherein
    a sand abrasion mass loss of a hard-coating-film coated test piece for 30 minutes is 0.05 g or less, the sand abrasion mass loss being measured by using a sand abrasion tester complying with the ASTM-G65 standards under conditions below:
    substrate dimension of hard-coating-film coated test piece: flat plate shape of 25 mm×75 mm×8 mm (thickness),
    disc dimensions: width 12.7 mm x @ 220 mm,
    test force: 127.5 N (13 kgf),
    test sand: No. 6 silica sand, flow rate: 350 g/min,
    wheel rotation speed: 200 rpm, and
    test time: 30 minutes.

2. The sand-abrasion-resistant hard coating film according to claim 1, wherein
    the composition is represented by the formula: $(Al_xCr_y)N$ (where, $0.70 \geq x \geq 0.55$, $y > 0$, $x > y$ and $x+y=1$).

3. The sand-abrasion-resistant hard coating film according to claim 1, wherein the hard coating film is a coating film formed by a physical vapor deposition method.

4. A sand-abrasion-resistant hard-coating-film coated member comprising:
    a substrate; and
    the sand-abrasion-resistant hard coating film according to claim 1,
    wherein the hard coating film is formed on at least a part of a surface of the substrate, the surface being subjected to abrasion by a sand component contained in a liquid or a solid.

5. The sand-abrasion-resistant hard-coating-film coated member according to claim 4, wherein the hard coating film has a thickness of 100 μm or less.

6. The sand-abrasion-resistant hard-coating-film coated member according to claim 4, wherein the hard coating film has a thickness of 59.2 μm or less.

7. The sand-abrasion-resistant hard-coating-film coated member according to claim 4, wherein the hard coating film is a coating film formed by a physical vapor deposition method.

* * * * *